United States Patent [19]
Kuroda et al.

[11] Patent Number: 4,680,618
[45] Date of Patent: Jul. 14, 1987

[54] PACKAGE COMPRISING A COMPOSITE METAL BODY BROUGHT INTO CONTACT WITH A CERAMIC MEMBER

[75] Inventors: Toshio Kuroda; Koichi Kumazawa, both of Nagoya, Japan

[73] Assignee: Narumi China Corporation, Nagoya, Japan

[21] Appl. No.: 530,093

[22] Filed: Sep. 7, 1983

[30] Foreign Application Priority Data

Sep. 9, 1982 [JP] Japan ................. 57-157684

[51] Int. Cl.$^4$ ............................................. H01L 23/02
[52] U.S. Cl. ........................................ 357/74; 357/65; 357/67; 357/81
[58] Field of Search ............... 357/65, 67, 74, 75, 357/81

[56] References Cited

U.S. PATENT DOCUMENTS 3,685,134  8/1972  Blue ........................... 357/67 X
3,829,598  8/1974  Darnell ......................... 357/81
3,928,907  12/1975  Chisholm ....................... 357/81
4,025,997  5/1977  Gernitis et al. .................. 357/81
4,427,993  1/1984  Fichot et al. .................... 357/81

Primary Examiner—William L. Sikes
Assistant Examiner—Frank González
Attorney, Agent, or Firm—Hopgood, Calimafde, Kalil, Blaustein & Judlowe

[57] ABSTRACT

In a package comprising a ceramic member so as to accommodate a semiconductor device, a composite metal body which comprises copper and either one of tungsten and molybdenum is brought into contact with the ceramic member. The composite metal body is provided by impregnating molten copper into a porous block of tungsten or molybdenum and changeable in a thermal expansion coefficient and a thermal conductivity by controlling an amount of copper. The composite metal block may be used as a support for supporting the semiconductor device and/or as a heat sink for dissipating heat radiated from the semiconductor device. Preferably, the composite metal body comprises, by weight, 1–30% of copper and 99–70% of tungsten or molybdenum.

2 Claims, 7 Drawing Figures

PACKAGE COMPRISING A COMPOSITE METAL BODY BROUGHT INTO CONTACT WITH A CERAMIC MEMBER

BACKGROUND OF THE INVENTION

This invention relates to a package for use in encapsulating a semiconductor device, such as a transistor, a large scale integration (LSI) device, a charge-coupled device (CCD), or the like.

As will later be described with reference to a few figures of the accompanying drawing, various types of packages are used to encapsulate a wide variety of semiconductor devices. In other words, each package is selected in consideration of a characteristic and a size of each semiconductor device. Anyway, each package comprises a base member for supporting each semiconductor device and a ceramic frame member attached to the base member so as to surround the semiconductor device. When a ceramic material is used to form the base member, no crack occurs on the base and the ceramic frame members because a thermal expansion coefficient of the base member is substantially equal to that of the ceramic frame member. However, the base member has a tendency to be deformed with an increase of a size of the base member on manufacturing the package. Such deformation can be avoided by the use of a metal base member which serves as a heat sink also. Use of the metal base member often causes cracks to occur on the ceramic frame member due to a difference in thermal expansion coefficients between the metal base member and the ceramic frame member.

SUMMARY OF THE INVENTION

It is an object of this invention to provide a package for use in encapsulating a semiconductor device, which is capable of avoiding deformation even when the package is enlarged in size.

It is another object of this invention to provide a package of the type described, wherein occurrence of cracks is avoidable.

A package to which this invention is applicable is for use in encapsulating a semiconductor device and comprises a first member of a ceramic material and a second member brought into contact with the first member. According to this invention, the second member is of a composite metal comprising, by weight, 1-30% of copper and 99-70% of a preselected material selected from a group of tungsten and molybdenum.

The second member is provided by impregnating molten copper into a porous block of the preselected material. Such a composite metal is different from an alloy of copper and tungsten or molybdenum.

DESCRIPTION OF THE PREFERRED EMBODIMENTS

Figure 1:
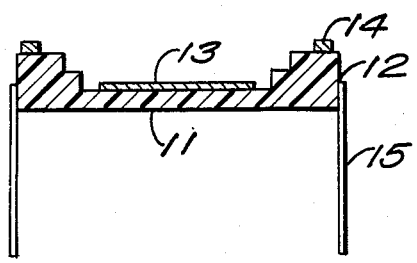
FIG. 1 shows a cross sectional view of a conventional package with a cap member removed therefrom.
Figure 2:
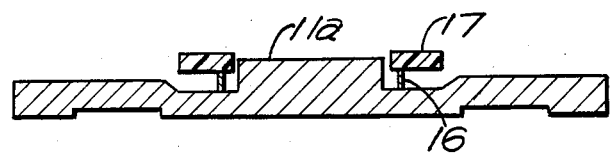
FIG. 2 is a similar view of another conventional package.
Figure 3:
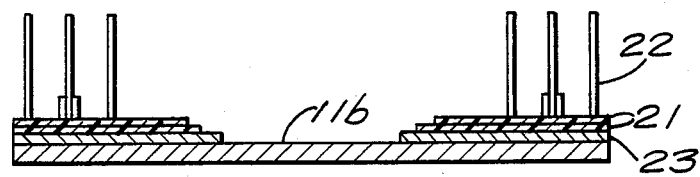
FIG. 3 is a similar view of a further conventional package.

Referring to FIGS. 1 through 3, conventional packages will be described for a better understanding of this invention. In FIG. 1, the illustrated conventional package is for use in encapsulating a charge-coupled device (CCD). The package comprises a ceramic base member 11 having a principal surface directed upwards of FIG. 1. The principal surface has a center area and a peripheral area surrounding the center area. A wall or a frame member 12 rests on the peripheral area with the center area uncovered and is made integral with the base member 11. A metallized layer 13 is partially attached to the center area to define a mounting region for mounting a semiconductor device. A metal frame 14 is formed on an upper surface of the wall member 12. A plurality of conductive leads 15 are attached to an external surface of the package.

On manufacturing the illustrated package, provision is made of a plurality of green ceramic sheets on which metallized patterns are formed. Thereafter, such green ceramic sheets are laminated and sintered with a pressure applied thereto, so as to be united with one another.

With this structure, undulation and deformation often takes place on the base member 11 due to the pressure applied to the green ceramic sheets. The package is weak in adhesion of the device mounted on the mounting region because the center area is not flat.

In FIG. 2, the illustrated conventional package is for use in supporting a high frequency and high power transistor and comprises a base member 11a of pure copper, namely, oxygen free copper. The base member 11a serves not only as a support but also as a heat sink for dissipating heat radiated from the transistor and has a center area and a peripheral area surrounding the center area. A recessed portion is formed around the center area on the peripheral area. A metal frame 16 of Kovar or pure copper is attached to the recessed portion by solder. A ceramic frame 17 is mounted on the metal frame 16.

The metal frame 16 lends itself to relax a difference in a thermal expansion coefficient between pure copper and ceramic. In other words, cracks are often caused to occur on the ceramic frame 17 unless the metal frame 16. Therefore, the illustrated package is intricate in structure.

In FIG. 3, the illustrated conventional package is called a pin grid array. The pin grid array is equal to or greater than 25 mm square in size and is suitable for mounting a very large scale integration (VLSI) device of a big size. The illustrated package comprises a base member 11b of pure copper having a principal surface directed upwards of FIG. 3. The base member 11b serves as a support for supporting the VLSI device and as a heat sink for dissipating heat. The principal surface has a center area and a peripheral surface surrounding the center area.

In the meanwhile, it is difficult to directly mount a ceramic material on the pure copper base member 11b. On the other hand, a ceramic frame 21 should be put on the base member 11b so as to support a plurality of conductive pins 22 implanted on the ceramic frame 21 and to electrically connect the respective pins 22 to the device with electrical connections isolated from one another.

Under the circumstances, an intermediate layer 23 of Kovar is laid between the ceramic frame 21 and the base member 11b of pure copper. However, the illustrated package is inconvenient because of a serious difference in thermal expansion coefficients between Kovar and pure copper.

Figure 4:
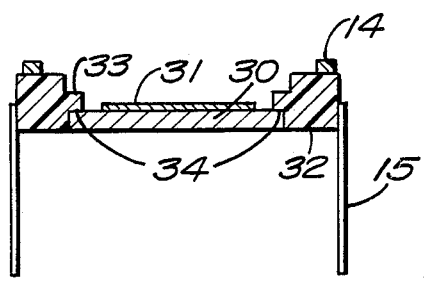
FIG. 4 shows a cross sectional view of a package according to a first embodiment of this invention.

Referring to FIG. 4, a package according to a first embodiment of this invention is for use in encapsulating a CCD, as is the case with FIG. 1. The illustrated package comprises a base member 30 having a predetermined configuration and consisting of a composite metal comprising molybdenum and copper. The base member 30 of the composite metal is manufactured by impregnating molten copper into porous molybdenum block. More particularly, the composite metal comprises, by weight, 15% of copper and 85% of molybdenum, and has a thermal expansion coefficient of $66 \times 10^{-7}$ and a thermal conductivity of 0.57 cal/cm·sec.°C.

The base member 30 is subjected to electrolytic plating to form a nickel layer 31 on a center area of the base member 30. The nickel layer 31 has a thickness between 2 and 3 microns and defines a mounting region for mounting the CCD.

A ceramic frame 32 is manufactured by laminating a plurality of green ceramic sheets in a usual technique and has an internal projection 33 which is extended inwardly of the ceramic frame 32 to define an opening and to support the base member 30. The projection 33 has a metallized portion 34 with which the base member 30 is brought into contact. Likewise, the ceramic frame 32 has metallized regions on an upper surface and an external surface.

The base member 30 is fitted with the projection 33 to be fixed to the ceramic frame 32 by the use of solder. The conductive leads 15 are fixed to the metallized regions on the external surface of the ceramic frame 32 by solder. The metallized pattern on the upper surface of the ceramic frame 32 is covered with solder to form the metal frame 14 for mounting a cap member (not shown). Subsequently, gold plating is made in a usual manner to cover the metallized patterns with a gold layer.

Thereafter, the package thus manufactured is subjected to a thermal cycle test and a thermal shock test both of which are determined by MIL-STD-883B and is thereafter investigated by the use of a helium leak detector. As a result, air tightness is not degraded. In addition, no undulation or deformation takes place on the base member 30.

Figure 5:
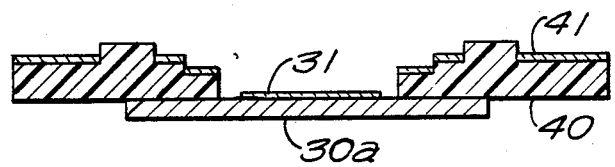
FIG. 5 shows a similar view of a package according to a second embodiment of this invention.

Referring to FIG. 5, a package according to a second embodiment of this invention comprises a base member 30a composed of a composite metal. The composite metal comprises, by weight, 1% of copper and 99% of molybdenum and has a thermal expansion coefficient close to that of silicon. Specifically, the thermal expansion coefficient of the composite metal is equal to $54 \times 10^{-7}$. The base member 30a has a principal surface which is directed upwards of FIG. 5 and which has a center area and a peripheral area surrounding the center area. The center area is coated by plating with a nickel layer 31 which defines mounting region, as is the case with FIG. 4. The nickel layer 31 has a predetermined thickness between 2 and 3 microns.

A plurality of ceramic frames 40 are manufactured by preparing a plurality of green ceramic sheets on which metallized patterns are formed in a known manner, by laminating the green ceramic sheets, and by sintering the same so as to unite the laminated sheets with one another. In this state, the sintered sheets are not divided into individual pieces. Under the circumstances, the base members 30a are attached to the sintered sheets by solder. Thereafter, the metallized patterns are covered with a metal layer to form leads 41. The sintered sheets combined with the base members 30a are cut into the individual pieces serving as chip carriers, respectively. The respective chip carriers exhibit favorable results through tests similar to those described in conjunction with FIG. 4. At any rate, each of the base members 30a serves to mount or support a semiconductor chip.

Figure 6:
FIG. 6 shows a similar view of a package according to a third embodiment of this invention.

Referring to FIG. 6, a package according to a third embodiment of this invention is similar to that illustrated in FIG. 2 except that the base member 30b consists of a composite metal of copper and tungsten and that the metal frame 16 illustrated in FIG. 2 is removed from FIG. 6. More particularly, the illustrated base member 30b has a principal surface which is directed upwards of FIG. 6 and which has a center area and a peripheral area surrounding the center area. A recessed portion is formed around the center area on the peripheral area. A ceramic frame 17 is placed on the recessed portion and fixed thereto by solder. The ceramic frame 17 may be manufactured by laminating a plurality of green ceramic sheets and by sintering the laminated green sheets into a united body or may be manufactured by pressing a ceramic sheet. The base member 30b must be operable as a support and a heat sink. In other words, the base member 30b should have a favorable thermal conductivity suitable for dissipating heat radiated from the transistor and a thermal expansion coefficient close to that of a ceramic material. By way of example, the thermal expansion coefficient of the ceramic material is between $50 \times 10^{-7}$ and $85 \times 10^{-7}$. Under the circumstances, the composite metal of the base member 30b comprises, by weight, 25% of copper and 75% of tungsten. With the base member 30b of the above composite metal, no cracks occur on the ceramic frame 17 even when the ceramic frame 17 is directly brought into contact with the base member 30b.

Such a composite metal is prone to become large in the thermal conductivity and the thermal expansion coefficient with an increase of an amount of copper, as will later be described in detail.

Instead of the above-mentioned composite metal, provision was made of an additional composite metal comprising, by weight, 35% of copper and 65% of tungsten to form an additional base member. With the additional base member, cracks appeared on the ceramic frame 17. The ceramic frame 17 partially tore off the base member 30b in some days. Accordingly, it is preferable that the amount of copper in the composite metal is between 1 and 30% by weight.

Figure 7:
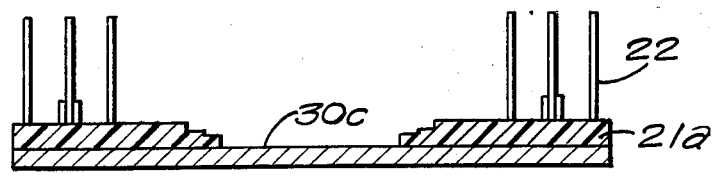
FIG. 7 shows a similar view of a package according to a fourth embodiment of this invention.

Referring to FIG. 7, a package according to a fourth embodiment of this invention is similar to that illustrated in FIG. 3 except that a base mamber 30c consists of a composite metal of copper and tungsten and that the intermediate layer 23 illustrated in FIG. 3 is removed from FIG. 7. The base member 30c of the composite metal has a principal surface which is directed upwards of FIG. 3 and which has a center area and a peripheral area surrounding the center area. A nickel layer is formed on the center area by plating and has a thickness between 1 micron and 3 microns.

It is preferable that the base member 30c which is available to the pin grid array has a good thermal conductivity and a thermal expansion coefficient close to that of a ceramic material forming the ceramic frame 21a, as described in conjunction with FIG. 3.

For this purpose, use is made of the composite metal which comprises, by weight, 15% of copper and 85% of tungsten and which has the thermal expansion coefficient of $64 \times 10^{-7}$ and the thermal conductivity of 0.62 cal/cm·sec·°C.

A ceramic frame 21a is manufactured by stacking three green ceramic sheets on which metallized patterns are formed in a usual manner and by sintering the stacked ceramic sheets to unite them. The ceramic frame 21a is directly mounted on the peripheral surface of the base member 30c by solder. In this event, the pins 22 are fixed onto the ceramic frame 30c by the use of solder to form a combined body. The number of the pins 22 may be between 70 and several hundreds. The combined body is subjected to nickel plating and gold plating in a usual manner and formed into the package.

According to the inventors' experimental studies, it has been confirmed that no crack takes place on the ceramic frame 21a. This is because the composite metal has the thermal expansion coefficient near the ceramic material of the ceramic frame 21a.

Now, consideration will be directed to the base members used in the packages illustrated in FIGS. 4 through 7. On manufacturing each base member, provision should be made of a composite metal body. Such a composite metal body is provided by preparing a porous tungsten block or a porous molybdenum block as a core material and by impregnating a molten copper into the core material.

Table 1 shows characteristics of the composite metal body of copper and tungsten. In Table 1, the thermal expansion coefficient and the thermal conductivity are shown in relation to an amount of copper impregnated into the porous tungsten block. Likewise, Table 2 shown similar characteristics of copper and molybdenum.

experimental studies, it has been found out that each of the composite metal bodies can favorably be used in combination with an alumina ceramic frame when each composite metal body comprises, by weight, 1-30% of copper.

Furthermore, each of the composite metal bodies exhibits the thermal conductivity considerably higher than that of each ceramic frame on condition that the thermal expansion coefficient of each composite metal body is substantially equal to that of each ceramic frame. In the meantime, beryllia ceramics have the thermal conductivity of 0.38 cal/cm·sec·°C. and the thermal expansion coefficient of $76 \times 10^{-7}$. Inasmuch as the beryllia ceramics exhibit the highest thermal conductivity, it is readily understood that the composite metal bodies enumerated in Tables 1 and 2 have the thermal conductivity higher than the ceramic materials. Therefore, each of the composite metal bodies may be available as a heat sink attached to ceramic members, such as the ceramic frame the ceramic wall member, and the like.

Whie this invention has thus far been described in conjunction with several embodiments thereof, it will readily be possible for those skilled in the art to put this invention into practice in various manners. For example, the composite metal body can be attached to various kinds of ceramic materials, such as mullite, alumina, silicon carbide by controlling the amount of copper so as to adjust the thermal expansion coefficient to that of each ceramic material. Thus, the composite metal body can readily be substituted for each of the ceramic materials and can therefore be used as a base member and/or a heat sink. The composite metal body may be used as an electrode when a semiconductor device is mounted on the body. As a result, the number of parts can be reduced.

What is claimed is:

1. A package for use in encapsulating a semiconductor device, said package comprising a first member of a ceramic material and a second member of composite material comprising by weight of about 1 to 30% of a

TABLE 1

| Amount of Cu (% by weight) | 0 | 1 | 5 | 10 | 15 | 20 | 25 | 28 | 30 | 40 | — | 100 |
|---|---|---|---|---|---|---|---|---|---|---|---|---|
| Expansion Coefficient ($\times 10^{-7}$) | 45 | 53 | 56 | 60 | 64 | 68 | 75 | 79 | 83 | 97 | — | 165 |
| Conductivity (cal/cm · sec · °C.) | 0.40 | 0.43 | 0.49 | 0.56 | 0.62 | 0.66 | 0.70 | 0.73 | 0.74 | 0.79 | — | 0.94 |

TABLE 2

| Amount of Cu (% by weight) | 0 | 1 | 5 | 10 | 15 | 20 | 25 | 28 | 30 | 40 | — | 100 |
|---|---|---|---|---|---|---|---|---|---|---|---|---|
| Expansion Coefficient ($\times 10^{-7}$) | 51 | 54 | 58 | 61 | 66 | 70 | 78 | — | 85 | 100 | — | 165 |
| Conductivity (cal/cm · sec · °C.) | 0.35 | 0.39 | 0.46 | 0.52 | 0.57 | 0.63 | 0.67 | — | 0.70 | 0.77 | — | 0.94 |

Inasmuch as the ceramic material has the thermal expansion coefficient between $50 \times 10^{-7}$ and $85 \times 10^{-7}$, as mentioned before, the thermal expansion coefficient of each composite metal body can be adjusted to that of the ceramic material used as each of the ceramic frames illustrated in FIGS. 4 through 7 by controlling the amount of copper impregnated into each of the porous tungsten and molybdenum blocks. Therefore, it is possible to form a metallic base member having a thermal expansion coefficient nearer to the ceramic material than those of the conventional metallic base members as shown in FIGS. 2 and 3. According to the inventors' copper portion and about 99 to 70% of a preselected material selected from the group consisting of tungsten and molybdenum in the form of a porous block, said porous block having been impregnated with said copper portion from the molten state of said copper.

2. The package of claim 1, wherein said second member has a principal surface having, in turn, a center area for supporting said semiconductor device and a peripheral area surrounding said center area, said first member contacting said second member on said peripheral area.

* * * * *